US008786005B2

(12) United States Patent
Basceri et al.

(10) Patent No.: US 8,786,005 B2
(45) Date of Patent: Jul. 22, 2014

(54) ONE-TRANSISTOR COMPOSITE-GATE MEMORY

(75) Inventors: Cem Basceri, Reston, VA (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 171 days.

(21) Appl. No.: 13/554,577

(22) Filed: Jul. 20, 2012

(65) Prior Publication Data

US 2012/0280306 A1  Nov. 8, 2012

Related U.S. Application Data

(60) Division of application No. 12/637,989, filed on Dec. 15, 2009, now Pat. No. 8,227,313, which is a continuation of application No. 11/782,442, filed on Jul. 24, 2007, now Pat. No. 7,633,116, which is a division of application No. 11/489,880, filed on Jul. 20, 2006, now Pat. No. 7,259,066, which is a continuation of application No. 10/926,675, filed on Aug. 26, 2004, now Pat. No. 7,268,388.

(51) Int. Cl.
*H01L 29/792* (2006.01)

(52) U.S. Cl.
USPC .......................................................... 257/324

(58) Field of Classification Search
USPC .................... 257/314–324, E27.085
See application file for complete search history.

(56) References Cited

U.S. PATENT DOCUMENTS

| 5,907,780 | A | 5/1999 | Gilmer et al. |
| 6,140,157 | A | 10/2000 | Warren et al. |
| 6,589,839 | B1 | 7/2003 | Basceri et al. |
| 6,674,110 | B2 | 1/2004 | Gnadinger |
| 7,045,406 | B2 | 5/2006 | Huotari et al. |
| 8,546,868 | B2 * | 10/2013 | Nakasaki et al. ............. 257/316 |
| 8,624,325 | B2 * | 1/2014 | Wenwu et al. ................ 257/369 |

OTHER PUBLICATIONS

S.A. Prosandeev, Sep. 1, 2002, pp. 1-5, "On the average charge of the oxygen vacancy in perovskites necessary for kinetic calculations".
Dr. Shashi P. Karna, http://www.afrlhorizons.com/Briefs/0012/VS9906.html, pp. 1-4, "Atomic Scale Description of Charge Trapping Centers in the Si—$SiO_2$Systems" Feb. 26, 2003.
Yang et al., 2001, IEEE, pp. 1-4, "One-Transistor PZT/$Al_2O_3$ and BLT/ $Al_2O_3$ Stacked Gate Memory".
Jun. 25, 2002, www.siliconstrategies.com, pp. 1-3, "Rolltronics' 'roll-to-roll' chip process could enable nanoscale memories".

(Continued)

*Primary Examiner* — Cuong Q Nguyen
(74) *Attorney, Agent, or Firm* — Dicke, Billig & Czaja, PLLC

(57) ABSTRACT

One-transistor memory devices facilitate nonvolatile data storage through the manipulation of oxygen vacancies within a trapping layer of a field-effect transistor (FET), thereby providing control and variation of threshold voltages of the transistor. Various threshold voltages may be assigned a data value, providing the ability to store one or more bits of data in a single memory cell. To control the threshold voltage, the oxygen vacancies may be manipulated by trapping electrons within the vacancies, freeing trapped electrons from the vacancies, moving the vacancies within the trapping layer and annihilating the vacancies.

23 Claims, 3 Drawing Sheets

(56) References Cited

OTHER PUBLICATIONS

Park et al., Mar. 29, 1999, Applied Physics Letters, pp. 1907-1909, "Differences in nature of defects between $SrBi_2Ta_2O_9$ and $Bi_4Ti_3O_{12}$".

Noh et al., Dec. 2001, Journal of Korean Physical Society, pp. S35-S38 "A New Ferroelectric Material for FRAM Applications: Lanthanum-Substituted Bismuth Titanate".

Pinto et al., pp. 1-4 "Theoretical study of oxygen-vacancy defects in ferroelectric $BaTiO_3$" 2001.

Gerstner et al., Nov. 15, 1998, Journal of Applied Physics, pp. 5647-5651, "Nonvolatile memory effects in nitrogen doped tetrahedral amorphous carbon thin films".

Kakuno et al., 2002, Journal of Crystal Growth, pp. 487-491, "Growth process and interfacial structure of epitaxial $Y_2O_3$/Si thin films deposited by pulsed laser deposition".

John Baliga, Nov. 1, 1999, Semiconductor International, pp. 1-9, "New materials Enhance Memory Perfromance".

* cited by examiner

ONE-TRANSISTOR COMPOSITE-GATE MEMORY

RELATED APPLICATIONS

This application is a Divisional of U.S. patent application Ser. No. 12/637,989 (allowed) filed Dec. 15, 2009, now U.S. Pat. No. 8,227,313 and titled "ONE-TRANSISTOR COMPOSITE-GATE MEMORY," which is a Continuation of U.S. patent application Ser. No. 11/782,442, filed Jul. 24, 2007, now U.S. Pat. No. 7,633,116, issued on Dec. 15, 2009, which is a divisional of U.S. patent application Ser. No. 11/489,880, filed Jul. 20, 2006, now U.S. Pat. No. 7,259,066, issued on Aug. 21, 2007, which is a continuation of U.S. patent application Ser. No. 10/926,675, filed Aug. 26, 2004, now U.S. Pat. No. 7,268,388, issued on Sep. 11, 2007, each of which is commonly assigned and incorporated by reference in its entirety herein.

TECHNICAL FIELD OF THE INVENTION

The present invention relates generally to integrated circuit devices and, in particular, to the formation of composite-gate semiconductor memory cells and devices.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

Semiconductor memories generally fall into two groups: volatile and nonvolatile. Volatile memories are typically characterized by their fast access for both read and write operations. However, the content of volatile memories is lost when power is removed. Nonvolatile memories can often have read access as fast, or nearly as fast, as volatile memories, but write operations are generally slower. The advantage of nonvolatile memories is that their contents are retained, sometimes on the order of years, without power.

One type of nonvolatile memory is formed of a field-effect transistor (FET) having a floating gate capable of holding a charge. The presence or absence of stored charge on the floating-gate alters the threshold voltage (Vt) of the transistor. Floating gates are generally formed of polysilicon. To retain the charge for extended periods, the floating gate is isolated from surrounding structures by an insulator or dielectric material. The floating gate is isolated from the channel region of the transistor by a gate dielectric layer and from a conductive control gate by an intergate dielectric layer. To maintain the nonvolatile nature of the device, charge leakage from the floating gates of typical flash memory devices must be extremely low.

Other one-transistor memory cells are also known, such as ferroelectric memory cells. Ferroelectric memories exploit the properties of ferroelectric materials. These materials are useful in semiconductor memories as they have characteristics to provide a nonvolatile memory function; after a ferroelectric material has been polarized in one direction, it will hold that polarization for an extended time without further power input.

Ferroelectric materials have been successfully integrated into integrated circuit processes, but this integration can have some drawbacks. Ferroelectric materials having sufficient thermal stability for integrated circuit processing often include incompatible metals that must be separated from a silicon substrate. Such ferroelectric materials also tend to be strong oxygen sources, increasing the risk of undesirable oxidation of adjacent materials. Additionally, ferroelectric materials generally can only withstand a finite number of polarization reversals before their performance degrades.

For the reasons stated above, and for other reasons stated below which will become apparent to those skilled in the art upon reading and understanding the present specification, there is a need in the art for alternate nonvolatile memory cells.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Figure 1:
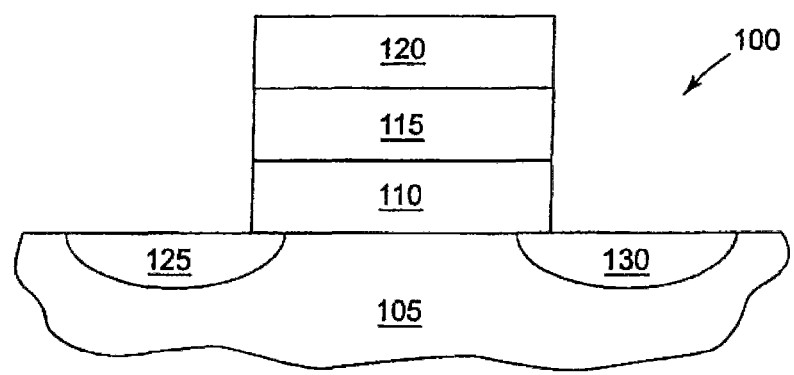
FIG. 1 is a cross-sectional view of a composite-gate memory cell in accordance with an embodiment of the invention.

FIG. 1 is a cross-sectional view of a composite-gate memory cell in accordance with an embodiment of the invention. In general, FIG. 1 depicts a composite-gate memory cell 100 having a gate dielectric layer 110 formed on a substrate 105. Gate dielectric layer 110 is generally a silicon oxide, but may be any dielectric material. Some specific examples include silicon oxides ($SiO/SiO_2$), silicon nitrides ($SiN/Si_2N/Si_3N_4$) and silicon oxynitrides ($SiO_xN_y$). Other dielectrics, such as metal oxide dielectrics are also suitable. For one embodiment, substrate 105 is a P-type silicon substrate.

A trapping layer 115 is formed over the gate dielectric layer 110. Trapping layer 115 includes one or more materials capable of holding oxygen vacancies. Some specific examples of materials for use in trapping layer 115 include aluminum oxides ($AlO_x$), hafnium oxides ($HfO_x$), zirconium oxides ($ZrO_x$), titanium oxides ($TiO_x$), hafnium silicate ($Hf-Si_xO_yNz$), zirconium silicate ($ZrSi_xO_yN_z$), tantalum oxide (TaO$_x$), barium strontium titanate (BST-Ba$_z$Sr$_{(1-z)}$TiO$_3$; where 0<z<1), lead zirconium titanate (PZT-Pb(Zr, Ti)O$_3$), etc. These materials may be either amorphous or crystalline depending on the desired performance as a trapping layer.

A control gate layer 120 is formed overlying the trapping layer 115. The control gate layer 120 includes one or more layers of conductive material. Examples include conductively-doped polysilicon, metals, metal silicides, conductive metal nitrides, conductive metal oxides, etc. For one example, control gate layer 120 includes a conductively-doped polysilicon layer formed overlying the trapping later 115, a titanium nitride (TiN) layer overlying the conductively-doped polysilicon layer and a tungsten (W) layer formed overlying the titanium nitride layer. Other layers, such as dielectric cap layers and sidewall spacers may be formed as is well known in the art of semiconductor fabrication.

The memory cell 100 further includes a first source/drain region 125 and second source/drain region 130 formed in the substrate 105 and having a conductivity different than a conductivity of the substrate 105. For example, if the substrate 105 has a p-type conductivity, the first and second source/drain regions 125 and 130 might have an n-type conductivity. The source/drain regions 125 and 130 are formed on either side of a channel region below the gate dielectric layer 110.

As one example of the formation of a structure such as depicted and described with reference to FIG. 1, the gate dielectric layer 110 is formed overlying and adjoining the substrate 105 such as by a thermal oxidation of the substrate 110. The trapping layer 115 is then formed overlying the gate dielectric layer 110. Trapping layer 115 may be formed via chemical and/or physical deposition processes. Some specific examples of such processes include chemical vapor deposition or sputtering. The choice of deposition processes is dependent upon the chosen materials of fabrication, and, where multiple layers of material form trapping layer 115, multiple deposition methods may be utilized. Control gate layer 120 is then formed overlying the trapping layer 115. Similar to trapping layer 115, control gate layer 120 may be formed via chemical and/or physical deposition processes. Additional layers, such as adhesion layers or diffusion barrier layers (not shown) may be formed where necessary based on the compatibility of the chosen materials of construction. The use of adhesion and/or diffusion barrier layers is well understood in the art of semiconductor fabrication and their use will not be detailed herein.

After formation of the various layers, the layers are then patterned to define the gate stack of memory cell 100. Patterning may include typical photolithographic techniques, such as the forming of a photoresist layer (not shown), masking and developing the photoresist layer, and removing portions of the layers 110, 115 and 120 exposed by the patterned photoresist layer. Examples of techniques for the removal of exposed portions of layers 110, 115 and 120 include wet etching and ion etching.

The first and second source/drain regions 125 and 130 may be formed by doping the substrate 105. Doping is usually performed through ion implantation techniques. Dopant sources for ion implantation techniques are often fluorine-based gases. For example, in the ion implantation of boron ions, the source gas may be boron trifluoride (BF$_3$). Thermal processing may be performed following the implantation in order to diffuse the ions and to repair surface damage caused by the ion bombardment. In addition to ion implantation techniques, other doping methods are known such as diffusion techniques using gaseous, liquid or solid dopant sources. Examples of dopant sources for the diffusion of boron include gaseous diborane (B$_2$H$_6$), liquid boron tribromide (BBr$_3$) and solid boron nitride (BN). Other dopant sources and specific techniques are well known in the art of semiconductor fabrication.

Figure 2:
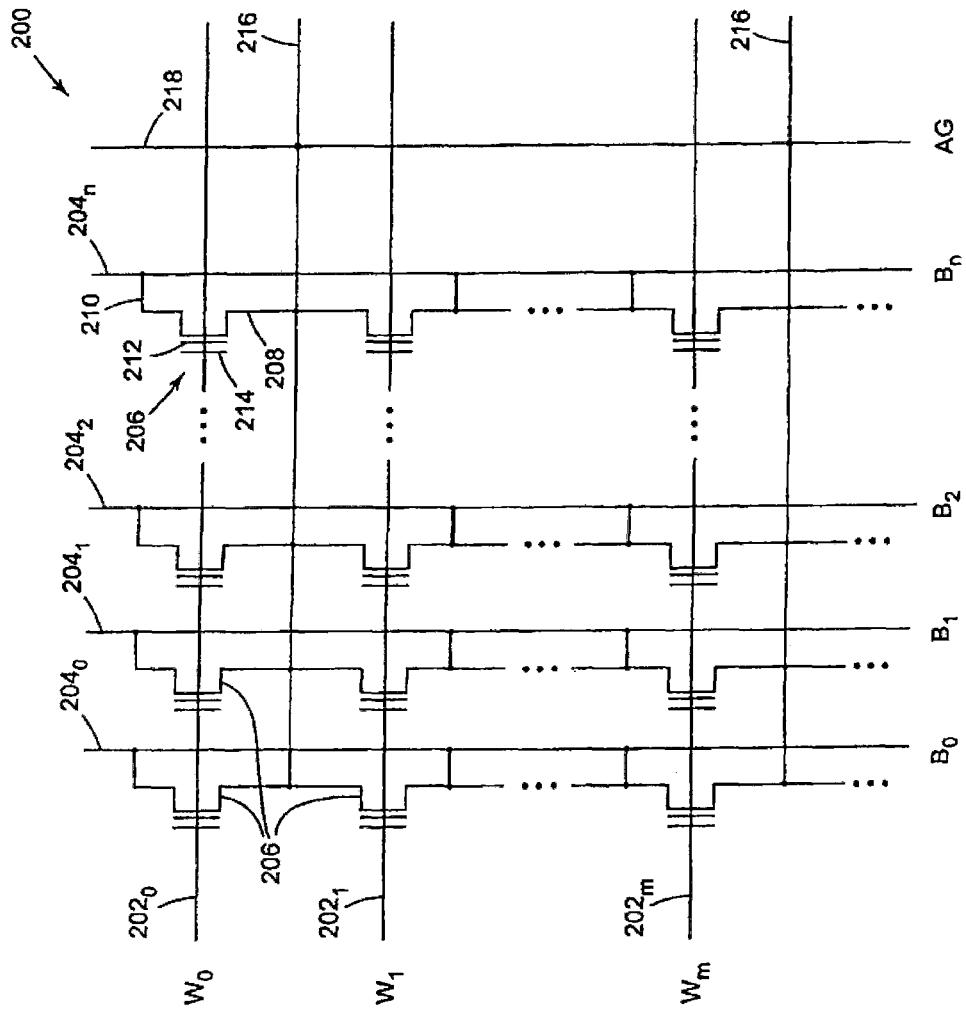
FIG. 2 is a schematic of a portion of a nonvolatile memory array in accordance with an embodiment of the invention.

FIG. 2 is a schematic of a portion of a nonvolatile memory array 200 as a portion of a memory device in accordance with one embodiment of the invention. The detail of memory array 200 is provided to better understand the various embodiments of the invention. The memory array 200 includes one-transistor memory cells in accordance with the invention. One-transistor memories typically utilize one of two basic architectures known as NOR architecture and NAND architecture. The designation is derived from the logic used to read the devices. In NOR architecture, a column of memory cells are coupled in parallel with each memory cell coupled to a bit line. In NAND architecture, a string of memory cells are coupled in series with only the first memory cell of the string coupled to a bit line.

The layout of FIG. 2 corresponds to one example of a NOR flash architecture. However, other types of memory arrays can benefit from embodiments of the invention. As one example, memory cells in accordance with the invention can be arranged as for NAND architectures as well, although only one drain contact is required per string and only one source interconnect is required per block. Accordingly, the invention is not limited to the specific layout described with reference to FIG. 2.

As shown in FIG. 2, the memory block 200 includes word lines 202 and intersecting local bit lines 204. For ease of addressing in the digital environment, the number of word lines 202 and the number of bit lines 204 are each some power of two, e.g., 256 word lines 202 by 4,096 bit lines 204. The local bit lines 204 may be selectively coupled to global bit lines (not shown) for coupling to sense amplifiers (not shown in FIG. 2).

Transistors 206 are located at each intersection of a word line 202 and a local bit line 204. The transistors 206 represent the nonvolatile memory cells for storage of data and are of the type described with reference to FIG. 1. Typical construction of such transistors 206 include a source 208 and a drain 210 constructed from an n$^+$-type material of high impurity concentration formed in a P-type semiconductor substrate of low impurity concentration, a channel region formed between the source and drain, a trapping layer 212, and a control gate 214. Trapping layer 212 is isolated from the channel region by a gate dielectric. Transistors 206 having their control gates 214 coupled to a word line 202 typically share a common source 208 depicted as array source interconnect 216. As shown in FIG. 2, transistors 206 coupled to two adjacent word lines 202 may share the same array source interconnect 216. Transistors 206 have their drains coupled to a local bit line 204. A column of the transistors 206 are those transistors commonly coupled to a given local bit line 204. A row of the transistors 206 are those transistors commonly coupled to a given word line 202.

The array source interconnects 216 may be coupled to a metal or other highly conductive line to provide a shared path to a ground potential node. The array ground 218 serves as this shared path. For one embodiment, a connection between an array source interconnect 216 and the array ground 218 occurs only once for each row of memory cells 206. Typical memory devices may make a contact between an array source interconnect and an array ground every 16 columns.

Figure 3:
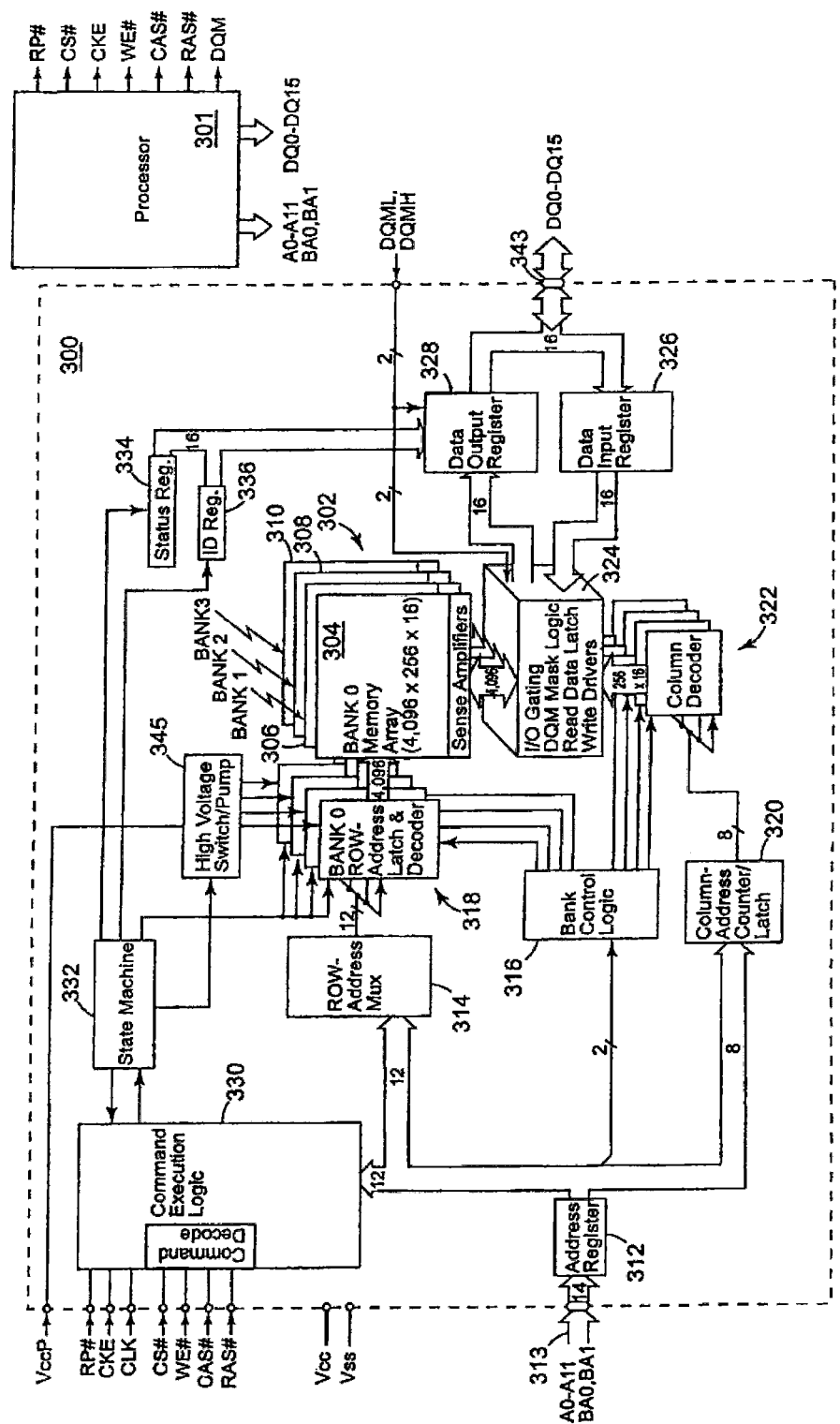
FIG. 3 is a functional block diagram of a basic flash memory device in accordance with an embodiment of the invention coupled to a processor.

FIG. 3 is a functional block diagram of a basic memory device 300 that is coupled to a processor 301. The memory device 300 and the processor 301 may form part of an electronic system. The memory device 300 has been simplified to focus on features of the memory that are helpful in understanding the present invention. The memory device 300 includes an array of nonvolatile memory cells 302. The memory array 302 includes memory cells formed in accordance with an embodiment of the invention.

The memory array 302 is arranged in rows and columns, with the rows arranged in blocks. A memory block is some discrete portion of the memory array 302. Individual word lines generally extend to only one memory block while bit lines may extend to multiple memory blocks. The memory cells generally can be erased in blocks. Data, however, may be stored in the memory array 302 separate from the block structure.

The memory array 302 is arranged in a plurality of addressable banks. In one embodiment, the memory contains four memory banks 304, 306, 308 and 310. Each memory bank contains addressable sectors of memory cells. The data stored in the memory can be accessed using externally provided location addresses received by address register 312 from processor 301 on address lines 313. The addresses are decoded using row address multiplexer circuitry 314. The addresses are also decoded using bank control logic 316 and row address latch and decode circuitry 318.

To access an appropriate column of the memory, column address counter and latch circuitry 320 couples the received addresses to column decode circuitry 322. Circuit 324 provides input/output gating, data mask logic, read data latch circuitry and write driver circuitry. Data is input through data input registers 326 and output through data output registers 328. This bi-directional data flow occurs over data (DQ) lines 343.

Command execution logic 330 is provided to control the basic operations of the memory device including memory read operations. A state machine 332 is also provided to control specific operations performed on the memory arrays and cells. A high voltage switch and pump circuit 345 is provided to supply higher voltages during erase and write operations. A status register 334 and an identification register 336 can also be provided to output data.

The memory device 300 can be coupled to an external memory controller, or processor 301, to receive access commands such as read, write and erase command. Other memory commands can be provided, but are not necessary to understand the present invention and are therefore not outlined herein. The memory device 300 includes power supply inputs Vss and Vcc to receive lower and upper voltage supply potentials.

As stated above, the memory device 300 has been simplified to facilitate a basic understanding of the features of the memory device. A more detailed understanding of one-transistor memory architectures is known to those skilled in the art. As is well known, such memory devices 300 may be fabricated as integrated circuits on a semiconductor substrate.

One-transistor memory cells are capable of storing data values by altering their threshold voltages (Vt). The stored data value may then be sensed by applying a read voltage to the control gate of the memory cell. If the Vt is above the read voltage, the memory cell will not turn on and will essentially remain non-conducting. If the Vt is below the read voltage, the memory cell will turn on and allow current flow between its source/drain regions. By sensing the resulting presence or absence of current flow, or an accompanying voltage change, the data value of the cell may be ascertained.

The memory cells of the invention are also capable of storing more than one bit. Multiple bits may be stored per memory cell by controlling the Vt of the transistor to have more than two levels and assigning a bit pattern to a specific range of Vt. For example, a cell may be assigned four different Vt ranges of 200 mV for each range. Typically, a dead space or guard band of 200 to 400 mV is between each range. If the Vt of the cell is within the first range, the cell is storing a 00. If the Vt is within the second range, the cell is storing a 01. This continues for as many ranges as are used for the cell. The various data values may then be sensed by applying the appropriate read voltages.

Manipulating the oxygen vacancies within the trapping layer can take many forms. Oxygen vacancies can be altered during processing, such as by modifying oxygen content of the materials during their formation or after formation, such as during a post-deposition anneal. Modification of oxygen content may occur through the control of oxygen levels in the deposition chamber, for example.

After fabrication, the oxygen vacancies may be neutral, positively charged or negatively charged. In most cases, the oxygen vacancies will generally be positively charged, e.g., a plus two effective charge—Vo++. In this state, the memory cell may be in a depletion mode, requiring the application of a negative gate-source voltage to deactivate the transistor. To program the memory cell to a second data value from its initial threshold voltage, one or two electrons may be injected into each oxygen vacancy through the application of a first bias, i.e., a voltage applied across the trapping layer. The value of this bias will be dependent upon the material chosen. As the number of trapped electrons increases, the Vt will likewise increase. To remove or untrap the electrons, a second bias, typically higher than the first bias, is applied across the trapping layer. This application of the second bias makes use of the well-known hopping mechanism to remove the electrons from the oxygen vacancies.

In addition to injecting and removing electrons to and from the oxygen vacancies, the oxygen vacancies may be moved within the trapping layer or annihilated in order to effect a change on the memory cell's Vt. As an example, a bias can be applied across the trapping layer to drive the oxygen vacancies toward an electrode. If the electrode is a metal electrode, such as a metal layer of the control gate, the oxygen vacancies will accumulate at the interface between the trapping layer and the metal electrode. If the electrode is an oxygen source, such as an oxygen-rich gate dielectric layer or an oxygen-rich conductive metal oxide of the control gate, the oxygen vacancies will be annihilated, thus freeing the electrons at the interface. Examples of conductive metal oxides include iridium oxide (IrOx) or ruthenium oxide (RuOx). For such embodiments utilizing annihilation of the oxygen vacancies during programming, oxygen vacancies must be regenerated in order to restore the trapping layer's ability to store electrons.

Regeneration of oxygen vacancies can be accomplished through the generation of ultraviolet (UV) light near the trapping layer. For one embodiment, the substrate upon which the memory cell is formed is made of porous silicon. Formation of porous silicon is well understood, but typically involves anodizing the silicon substrate in a hydrofluoric acid bath. As published extensively, sufficient voltage applied to the gate of a transistor causes electrons and holes to combine in porous silicon, thereby generating light. By generating UV light within the porous silicon, oxygen vacancies may be regenerated within the trapping layer.

The injection and removal of electrons to and from the oxygen vacancies, as well as the movement, annihilation and regeneration of oxygen vacancies, may be done on an individual cell basis. This differs from a standard Flash memory where memory cells are typically programmed individually, but erased in blocks.

CONCLUSION

One-transistor memory devices facilitate nonvolatile data storage through the manipulation of oxygen vacancies within a trapping layer of a field-effect transistor (FET), thereby providing control and variation of threshold voltages of the transistor. Various threshold voltages may be assigned a data value, providing the ability to store one or more bits of data in a single memory cell. To control the threshold voltage, the oxygen vacancies may be manipulated by trapping electrons within the vacancies, freeing trapped electrons from the vacancies, moving the vacancies within the trapping layer and annihilating the vacancies.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An adjustable threshold voltage field effect transistor, comprising:
    a first and a second source/drain region formed in a semiconductor substrate;
    a dielectric layer overlying the semiconductor substrate and at least a portion of each of the first and the second source/drain regions;
    a charge trap storage region comprising oxygen vacancies and formed over the dielectric layer where the oxygen vacancies present in the charge trap storage region can be manipulated; and
    a control gate formed over the charge trap storage region.

2. The field effect transistor of claim 1, wherein the semiconductor substrate comprises porous silicon.

3. The field effect transistor of claim 2, wherein the porous silicon semiconductor substrate is configured to generate ultraviolet (UV) light near the charge trap storage region in response to an applied voltage sufficient to cause electrons and holes to combine in the porous silicon semiconductor substrate.

4. The field effect transistor of claim 1, wherein the field effect transistor is a non-volatile memory cell.

5. A memory device, comprising:
    one or more memory cells, each memory cell comprising oxygen vacancies present in a charge trap layer of each memory cell; and
    control circuitry, wherein the control circuitry is configured to manipulate oxygen vacancies in the one or more memory cells to alter a threshold voltage of a memory cell.

6. The memory device of claim 5, wherein the control circuitry is configured to manipulate oxygen vacancies in a memory cell to alter a threshold voltage of a memory cell wherein the altered threshold voltage is representative of data stored in the memory cell.

7. The memory device of claim 5, wherein the control circuitry is further configured to perform an erase operation on a single memory cell of the one or more memory cells.

8. The memory device of claim 5, wherein the one or more memory cells each further comprises:
    a first and a second source/drain region formed in a semiconductor substrate;
    a dielectric layer overlying the semiconductor substrate and at least a portion of each of the first and the second source/drain regions;
    a control gate; and
    a charge trap layer formed between the dielectric layer and the control gate of each of the one or more memory cells.

9. The memory device of claim 5, wherein the control circuitry is configured to manipulate oxygen vacancies by one of movement of oxygen vacancies, annihilation of oxygen vacancies, and regeneration of oxygen vacancies.

10. The memory device of claim 9, wherein the memory device is configured to regenerate oxygen vacancies within the trap by generating ultraviolet light near the trap.

11. The memory device of claim 5, wherein the control circuitry is configured to manipulate oxygen vacancies by trapping electrons within the oxygen vacancies.

12. The memory device of claim 5, wherein the memory device is configured to manipulate oxygen vacancies by freeing trapped electrons within the oxygen vacancies.

13. The memory device of claim 5, wherein the memory device is configured to program the memory cell by injecting an electron into each of the oxygen vacancies.

14. A memory device comprising a memory cell, wherein the memory cell comprises:
    a channel region;
    a gate dielectric adjacent the channel region;
    a trap adjacent the gate dielectric; and
    a control gate adjacent the trap,
    wherein the memory device is configured to manipulate oxygen vacancies within the trap to facilitate data storage.

15. The memory device of claim 14, wherein the memory device is further configured to manipulate oxygen vacancies within the trap to control a threshold voltage of the cell.

16. The memory device of claim 14, wherein the memory device is configured to manipulate oxygen vacancies by trapping electrons within the oxygen vacancies.

17. The memory device of claim 14, wherein the memory device is configured to manipulate oxygen vacancies by freeing trapped electrons within the oxygen vacancies.

18. The memory device of claim 14, wherein the memory device is configured to manipulate oxygen vacancies by moving the oxygen vacancies within the trap.

19. The memory conductor device of claim 14, wherein the memory device is configured to manipulate oxygen vacancies by annihilating the oxygen vacancies.

20. The memory device of claim 14, wherein the memory device is configured to program the memory cell by injecting an electron into each of the oxygen vacancies.

21. The memory device of claim 19, wherein the memory device is configured to regenerate oxygen vacancies within the trap.

22. The memory device of claim 21, wherein the memory device is configured to regenerate oxygen vacancies within the trap by generating ultraviolet light near the trap.

23. The memory device of claim 14, wherein the memory device is configured to manipulate oxygen vacancies within the trap on a memory cell by memory cell basis.

* * * * *